United States Patent
Tomizawa et al.

(10) Patent No.: US 10,292,260 B2
(45) Date of Patent: May 14, 2019

(54) INSULATING LAYER FOR PRINTED CIRCUIT BOARD AND PRINTED CIRCUIT BOARD

(71) Applicant: MITSUBISHI GAS CHEMICAL COMPANY, INC., Tokyo (JP)

(72) Inventors: Katsuya Tomizawa, Tokyo (JP); Tomo Chiba, Tokyo (JP); Meguru Ito, Tokyo (JP); Eisuke Shiga, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 353 days.

(21) Appl. No.: 15/101,128

(22) PCT Filed: Jan. 6, 2015

(86) PCT No.: PCT/JP2015/050188
§ 371 (c)(1),
(2) Date: Jun. 2, 2016

(87) PCT Pub. No.: WO2015/105109
PCT Pub. Date: Jul. 16, 2015

(65) Prior Publication Data
US 2016/0309582 A1    Oct. 20, 2016

(30) Foreign Application Priority Data
Jan. 7, 2014 (JP) ................. 2014-001046
Jan. 23, 2014 (JP) ................. 2014-010653

(51) Int. Cl.
| | |
|---|---|
| B32B 3/10 | (2006.01) |
| H05K 1/02 | (2006.01) |
| B32B 15/08 | (2006.01) |
| C08J 5/24 | (2006.01) |
| H05K 1/03 | (2006.01) |
| H05K 3/02 | (2006.01) |
| C08J 5/04 | (2006.01) |
| H05K 3/46 | (2006.01) |

(52) U.S. Cl.
CPC .......... *H05K 1/0271* (2013.01); *B32B 15/08* (2013.01); *C08J 5/043* (2013.01); *C08J 5/24* (2013.01); *H05K 1/0298* (2013.01); *H05K 1/0393* (2013.01); *H05K 3/022* (2013.01); *H05K 3/4644* (2013.01); *C08J 2379/08* (2013.01); *C08J 2465/00* (2013.01); *C08J 2479/04* (2013.01); *H05K 1/036* (2013.01); *H05K 1/0366* (2013.01); *H05K 1/0373* (2013.01); *H05K 2201/0355* (2013.01); *H05K 2201/09136* (2013.01)

(58) Field of Classification Search
None
See application file for complete search history.

(56) References Cited

U.S. PATENT DOCUMENTS

| | | |
|---|---|---|
| 2009/0017316 A1 | 1/2009 | Kato et al. |
| 2011/0194261 A1 | 8/2011 | Tanaka et al. |
| 2012/0037413 A1 | 2/2012 | Kaneda |
| 2013/0002373 A1 | 1/2013 | Robert et al. |
| 2014/0199533 A1* | 7/2014 | Matsuura ........... C08G 59/5086 428/215 |
| 2014/0227531 A1 | 8/2014 | Ogashiwa et al. |
| 2014/0227924 A1 | 8/2014 | Nobukuni et al. |
| 2014/0242394 A1 | 8/2014 | Tsubuku et al. |

FOREIGN PATENT DOCUMENTS

| | | |
|---|---|---|
| JP | 10-72752 | 3/1998 |
| JP | 3173332 | 6/2001 |
| JP | 2004-335661 | 11/2004 |
| JP | 2009-35728 | 2/2009 |
| JP | 2011-71348 | 4/2011 |
| JP | 2011-178992 | 9/2011 |
| JP | 2012-197336 | 10/2012 |
| JP | 2013-1807 | 1/2013 |
| JP | 2013-21688 | 1/2013 |
| WO | 2010/113806 | 10/2010 |
| WO | 2012/165240 | 12/2012 |
| WO | 2012/165423 | 12/2012 |
| WO | 2013/008667 | 1/2013 |

OTHER PUBLICATIONS

Internaitonal Search Report issued in Japanese Patent Application No. PCT/JP2015/050188, dated Mar. 24, 2015.
International Preliminary Report on Patentability issued in PCT/JP2015/050188, dated Jul. 12, 2016.

* cited by examiner

*Primary Examiner* — Christopher M Polley
(74) *Attorney, Agent, or Firm* — Greenblum & Bernstein, P.L.C.

(57) ABSTRACT

The present invention provides an insulating layer for printed circuit boards having a difference of within 20% between the flexural modulus at 25° C. and the flexural modulus under heat at 250° C.

18 Claims, No Drawings

INSULATING LAYER FOR PRINTED CIRCUIT BOARD AND PRINTED CIRCUIT BOARD

TECHNICAL FIELD

The present invention relates to an insulating layer for printed circuit boards.

BACKGROUND ART

The high integration or high-density packaging of each component for semiconductor packages has been increasingly accelerated in recent years as semiconductor packages widely used in electronics, communication devices, personal computers, etc. have been more highly functionalized or miniaturized. Along with this, the difference in the coefficient of thermal expansion between a semiconductor device and a printed circuit board for semiconductor plastic packages causes the undesired warpage of semiconductor plastic packages. Various measures against this problem have been attempted.

One example of the measures includes reduction in thermal expansion of insulating layers for use in printed circuit boards. This approach is to suppress the warpage by bringing the coefficient of thermal expansion of a printed circuit board closer to the coefficient of thermal expansion of a semiconductor device and is currently being actively tackled (see e.g., Patent Documents 1 to 3).

In addition to the reduction in thermal expansion of printed circuit boards, increase in the rigidity of laminates (high rigidity) or increase in the glass transition temperatures of laminates (high Tg) has been studied as an approach for suppressing the warpage of semiconductor plastic packages (see e.g., Patent Documents 4 and 5).

LIST OF PRIOR ART DOCUMENTS

Patent Document

Patent Document 1: Japanese Patent Laid-Open No. 2013-216884
Patent Document 2: Japanese Patent No. 3173332
Patent Document 3: Japanese Patent Laid-Open No. 2009-035728
Patent Document 4: Japanese Patent Laid-Open No. 2013-001807
Patent Document 5: Japanese Patent Laid-Open No. 2011-178992

SUMMARY OF INVENTION

Problems to be Solved by Invention

However, the reduction in thermal expansion of printed circuit boards by the conventional approaches described in Patent Documents 1 to 3 has already approached their limits. Further reduction in thermal expansion is difficult.

The high rigidity of laminates is achieved by highly incorporating fillers into resin compositions for use in laminates or by using an inorganic filler having a high elastic modulus, such as alumina. The problems of these approaches, however, are that such high incorporating of fillers deteriorates the moldability of laminates while use of inorganic fillers such as alumina deteriorates the coefficient of thermal expansion of laminates. Thus, the high rigidity of laminates fails to achieve the sufficient suppression of the warpage of semiconductor plastic packages.

The approach based on the high Tg of laminates improves an elastic modulus during reflow and is therefore effective for reducing the warpage of semiconductor plastic packages. The approach based on the high Tg, however, causes deterioration in heat resistance upon moisture-absorbing ascribable to elevated crosslink density or the occurrence of voids resulting from poor moldability. This often becomes a practical problem in the field of electronic materials, which are required to have very high reliability. Thus, there has been a demand for an approach for solving these problems.

An object of the present invention is to provide an insulating layer for printed circuit boards that is capable of reducing warpage, for example, during semiconductor plastic package production, by use of an approach different from the conventional approaches.

Another object of the present invention is to provide an insulating layer for printed circuit boards that has favorable moldability and is excellent in heat resistance and elastic modulus under heat.

Means for Solving Problems

The present inventors have conducted diligent studies to attain the objects and consequently found that an insulating layer (e.g., a metal foil-clad laminate) for printed circuit boards having a difference of within 20% between the flexural modulus at 25° C. and the flexural modulus under heat at 250° C. effectively suppresses the warpage of, for example, semiconductor plastic packages, reaching the present invention.

The present inventors have also found that an insulating layer for printed circuit boards that has favorable moldability and is excellent in heat resistance and elastic modulus under heat can be provided by particularly using a resin composition comprising an alkenyl-substituted nadimide (A), a maleimide compound (B), a cyanic acid ester compound (C), and an inorganic filler (D) as a resin composition for use in the insulating layer for printed circuit boards, wherein the content of the cyanic acid ester compound (C) is 5 to 15 parts by mass based on 100 parts by mass in total of the components (A) to (C), and the ratio of the number of maleimide groups ($\beta$) in the maleimide compound (B) to the number of alkenyl groups ($\alpha$) in the alkenyl-substituted nadimide (A) [$\beta/\alpha$] is 0.9 to 4.3, reaching the present invention.

Specifically, the present invention relates to the following:

[1]

An insulating layer for printed circuit boards having a difference of 20% or less between a flexural modulus at 25° C. and a flexural modulus under heat at 250° C.

[2]

The insulating layer for the printed circuit board according to [1], wherein the insulating layer comprises a resin composition, the resin composition comprising an alkenyl-substituted nadimide (A), a maleimide compound (B), a cyanic acid ester compound (C), and an inorganic filler (D), wherein a content of the cyanic acid ester compound (C) is 5 to 15 parts by mass based on 100 parts by mass in total of the components (A) to (C), and a ratio of the number of a maleimide group ($\beta$) in the maleimide compound (B) to the number of an alkenyl group ($\alpha$) in the alkenyl-substituted nadimide (A) [$\beta/\alpha$] is 0.9 to 4.3.

[3]

The insulating layer for the printed circuit board according to [2], wherein the alkenyl-substituted nadimide (A) is a compound represented by the following general formula (1):

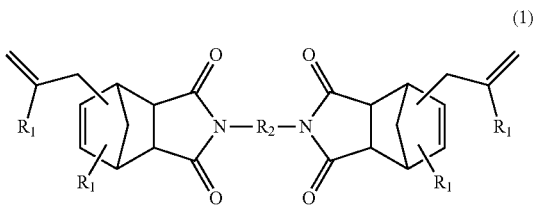

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

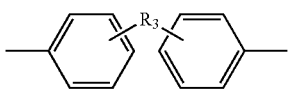

wherein $R_3$ represents a methylene group, an isopropylidene group, or a substituent represented by CO, O, S, or $SO_2$, and

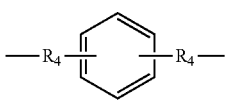

wherein each $R_4$ independently represents an alkylene group having 1 to 4 carbon atoms, or a cycloalkylene group having 5 to 8 carbon atoms.

[4]

The insulating layer for the printed circuit board according to [2], wherein the alkenyl-substituted nadimide (A) is a compound represented by the following formula (4) and/or (5):

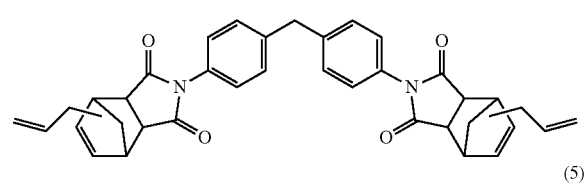

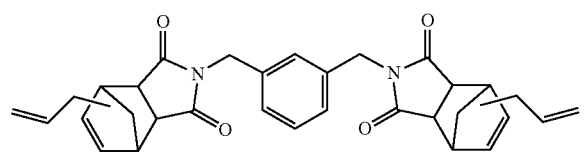

[5]

The insulating layer for the printed circuit board according to any of [2] to [4], wherein the maleimide compound (B) is at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane and a maleimide compound represented by the following general formula (6):

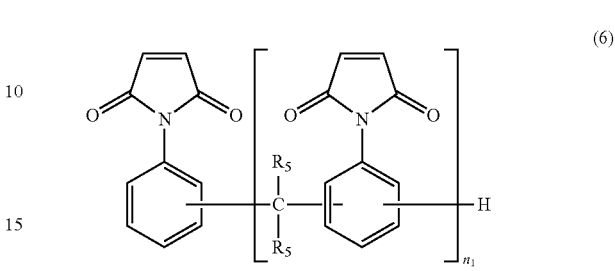

wherein each $R_5$ independently represents a hydrogen atom or a methyl group, and $n_1$ represents an integer of 1 or larger.

[6]

The insulating layer for the printed circuit board according to any of [2] to [5], wherein the cyanic acid ester compound (C) is a compound represented by the following general formula (7) and/or (8):

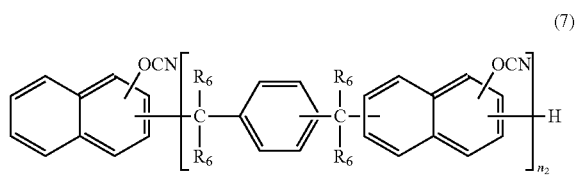

wherein each $R_6$ independently represents a hydrogen atom or a methyl group, and $n_2$ represents an integer of 1 or larger, and

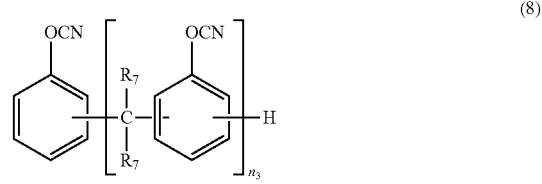

wherein each $R_7$ independently represents a hydrogen atom or a methyl group, and $n_3$ represents an integer of 1 or larger.

[7]

The insulating layer for the printed circuit board according to any of [1] to [6], wherein the insulating layer is a prepreg comprising a base material impregnated or coated with the resin composition.

[8]

The insulating layer for the printed circuit board according to [7], wherein the base material is at least one material selected from the group consisting of E glass cloth, T glass cloth, S glass cloth, Q glass cloth, and an organic fiber.

[9]

The insulating layer for the printed circuit board according to any of [1] to [6], wherein the insulating layer is a resin sheet comprising a support coated with the resin composition.

[10]

The insulating layer for the printed circuit board according to any of [1] to [6], wherein the insulating layer is a laminate obtained by curing one or more layers of at least one material selected from the group consisting of a resin sheet and a prepreg.

[11]

The insulating layer for the printed circuit board according to any of [1] to [6], wherein the insulating layer is a metal foil-clad laminate obtained by curing a metal foil laminated with at least one material selected from the group consisting of a resin sheet and a prepreg.

[12]

A printed circuit board using the insulating layer for the printed circuit board according to any of [1] to [11].

[13]

A printed circuit board comprising the insulating layer for the printed circuit board according to any of [1] to [11] and a conductor layer formed on the surface of the insulating layer.

Advantages of Invention

According to the present invention, an insulating layer having a difference of within 20% between a flexural modulus at 25° C. and a flexural modulus under heat at 250° C. is used as, for example, a printed circuit board material for use in semiconductor plastic packages, whereby the warpage of semiconductor plastic packages can be suppressed. Thus, a semiconductor plastic package excellent in production yields and reliability can be produced.

The present invention can also provide an insulating layer (e.g., a laminate or a copper-clad laminate) for printed circuit boards that has favorable moldability and is excellent in heat resistance and elastic modulus under heat. Such an insulating layer for printed circuit boards can further provide a printed circuit board that has favorable moldability and maintains the excellent elastic modulus even at a temperature as high as 250° C., which is close to a reflow temperature during semiconductor packaging.

MODE FOR CARRYING OUT INVENTION

Hereinafter, the mode for carrying out the present invention (hereinafter, also referred to as the "present embodiment") will be described. The embodiments below are given for illustrating the present invention, and the present invention is not intended to be limited by these embodiments.

The insulating layer for printed circuit boards (hereinafter, also simply referred to as an "insulating layer") of the present embodiment has a difference of 20% or less, preferably 0 to 20%, more preferably 0 to 15%, between the flexural modulus at 25° C. and the flexural modulus under heat at 250° C.

In the present embodiment, examples of the form of the insulating layer for printed circuit boards include, but are not particularly limited to: a prepreg in which a well-known base material, such as glass fiber cloth, organic fiber cloth, glass fiber nonwoven fabric, or organic fiber nonwoven fabric, which is used in insulating layers for printed circuit boards, is impregnated with an arbitrary thermosetting resin, thermoplastic resin, or the like, and a metal foil-clad laminate prepared by laminating this prepreg with a metal foil; an embedded sheet in the form of a metal foil or a film coated with any of these insulating resins; a sheet and a film of a resin including polyimide; and a metal foil-clad laminate prepared by laminating such a sheet or film with a metal foil. Specific examples of the embedded sheet include, but are not particularly limited to, CRS (sheet obtained by coating a copper foil with a resin, followed by drying) and FRS (Ajinomoto ABF: sheet obtained by coating a film with a resin, followed by drying). Specific examples of the resin sheet and film include, but are not particularly limited to, flexible boards obtained by the direct plating of a film or a resin and wiring.

Examples of the approach for setting the difference between the flexural modulus at 25° C. and the flexural modulus under heat at 250° C. of the insulating layer of the present embodiment to within 20% include, but are not particularly limited to, appropriately adjusting the type and content of each component in the resin composition for use in the insulating layer.

In addition to this approach, an existing method can be used as long as it does not thwart the objects of the present invention. Examples thereof include confining molecular motion by the introduction of nanofiller, hybridizing nanosilica by a sol-gel method to a crosslinking point in a resin for use in the insulating layer, achieving high Tg of a resin itself for use in the insulating layer, and rendering the resin Tg-less in a region of 400° C. or lower.

In the present embodiment, such an approach is preferably used in combination with a technique conventionally used for reducing warpage, from the viewpoint of the further suppression of warpage. Examples of such a technique include, but are not particularly limited to, conferring low thermal expansion or a high elastic modulus by the addition of an inorganic filler or a stress-relaxing component. These techniques may be used singly or in combinations of two or more thereof to more effectively reduce the warpage of semiconductor plastic packages.

In the case of employing achieving high Tg of a resin itself for use in the insulating layer or rendering the resin Tg-less in a region of 400° C. or lower as the approach for setting the difference between the flexural modulus at 25° C. and the flexural modulus under heat at 250° C. of the insulating layer of the present embodiment to within 20%, the resin for use in the insulating layer is not particularly limited and is preferably a thermosetting resin composed of a cyanic acid ester compound, a maleimide compound, an epoxy resin, benzoxazine, an alkenyl-substituted nadimide, a BT resin, an amine compound, a vinyl compound, or the like, from the viewpoint of insulation reliability, heat resistance, chemical resistance, and adhesion. These resins may be used singly or in combinations of two or more thereof.

In the insulating layer of the present embodiment, a resin composition containing an inorganic filler and an organic filler may be used, if necessary, in addition to the resin mentioned above. Examples of the types of the inorganic filler and the organic filler include, but are not particularly limited to, silicas (e.g., natural silica, fused silica, amorphous silica, and hollow silica), alumina, aluminum nitride, boron nitride, boehmite, molybdenum oxide, titanium oxide, silicone rubber, hybrid silicone powder, zinc borate, zinc stannate, clay, kaolin, talc, fired clay, fired kaolin, fired talc, mica, short glass fiber (fine glass powders such as E glass and D glass), hollow glass, and spherical glass. These fillers may be used singly or in a form of a suitable mixture of two or more thereof. Among them, silica is preferably used from the viewpoint of low thermal expansion. Alumina or aluminum nitride is preferably used from the viewpoint of high thermal conductivity.

The resin composition for use in the insulating layer of the present embodiment may be supplemented with a silane coupling agent and/or a wetting dispersant in order to improve the dispersibility of the filler and the adhesion strength between the resin and the filler or glass cloth. The silane coupling agent is not particularly limited as long as the silane coupling agent is generally used in the surface treatment of inorganic matter. Specific examples of the silane coupling agent include: aminosilane derivatives such as γ-aminopropyltriethoxysilane and N-β-(aminoethyl)-γ-aminopropyltrimethoxysilane; epoxysilane derivatives such as γ-glycidoxypropyltrimethoxysilane; vinylsilane derivatives such as γ-methacryloxypropyltrimethoxysilane; cationic silane derivatives such as N-β-(N-vinylbenzylaminoethyl)-γ-aminopropyltrimethoxysilane hydrochloride; and phenylsilane derivatives. These silane coupling agents may be used singly or in suitable combinations of two or more thereof. The wetting dispersant is not particularly limited as long as the wetting dispersant is used as a dispersion stabilizer for paint. Examples of the wetting dispersant include Disperbyk-110, -111, -180, and -161, BYK-W996, -W9010, and -W903 manufactured by BYK Japan K.K.

Among others, the resin composition for use in the insulating layer of the present embodiment is preferably a resin composition comprising an alkenyl-substituted nadimide (A), a maleimide compound (B), a cyanic acid ester compound (C), and an inorganic filler (D), wherein the content of the cyanic acid ester compound (C) is 5 to 15 parts by mass based on 100 parts by mass in total of the components (A) to (C), and the ratio of the number of maleimide groups (β) in the maleimide compound (B) to the number of alkenyl groups (α) in the alkenyl-substituted nadimide (A) [β/α] is 0.9 to 4.3. Hereinafter, the resin composition will be described in detail.

The alkenyl-substituted nadimide (A) used in the present embodiment is not particularly limited as long as the compound has one or more alkenyl-substituted nadimide groups in the molecule. Specific examples thereof include a compound represented by the following general formula (1):

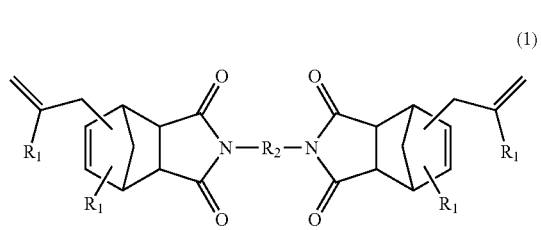

(1)

In the formula (1), each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following general formula (2) or (3):

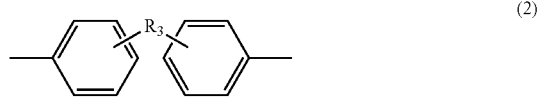

(2)

In the formula (2), $R_3$ represents a methylene group, an isopropylidene group, or a substituent represented by CO, O, S, or $SO_2$.

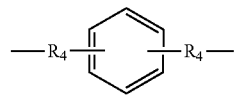

(3)

In the formula (3), each $R_4$ is independently selected and represents an alkylene group having 1 to 4 carbon atoms, or a cycloalkylene group having 5 to 8 carbon atoms.

A commercially available product can also be used as the alkenyl-substituted nadimide (A) represented by the formula (1). Examples of the commercially available product include, but are not particularly limited to, a compound represented by the formula (4) given below (BANI-M (manufactured by Maruzen Petrochemical Co., Ltd.)), and a compound represented by the formula (5) given below (BANI-X (manufactured by Maruzen Petrochemical Co., Ltd.)). These compounds may be used singly or in combinations of two or more thereof.

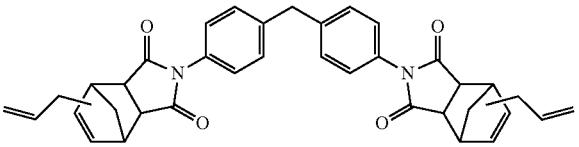

(4)

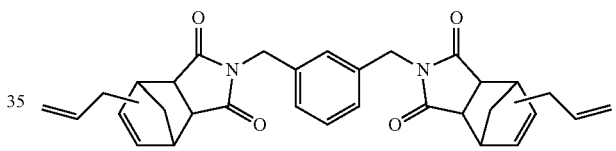

(5)

In the resin composition for use in the insulating layer of the present embodiment, the content of the alkenyl-substituted nadimide (A) is determined according to the ratio of the number of functional group between an alkenyl group, one of its functional groups, and a maleimide group in the maleimide compound (B) as mentioned later, and is preferably 25 to 45 parts by mass based on 100 parts by mass in total of the components (A) to (C) of the resin composition. The content of the component (A) falls within such a range, whereby the resulting printed circuit board can be excellent in moldability even when packed with a filler, and be excellent in curability, elastic modulus under heat, desmear resistance, and chemical resistance.

The maleimide compound (B) used in the present embodiment is not particularly limited as long as the compound has one or more maleimide groups in the molecule. Specific examples thereof include N-phenylmaleimide, N-hydroxyphenylmaleimide, bis(4-maleimidophenyl)methane, 2,2-bis{4-(4-maleimidophenoxy)-phenyl}propane, bis(3,5-dimethyl-4-maleimidophenyl)methane, bis(3-ethyl-5-methyl-4-maleimidophenyl)methane, bis(3,5-diethyl-4-maleimidophenyl)methane, a maleimide compound represented by the formula (6) given below, prepolymers of these maleimide compounds, and prepolymers of the maleimide compounds and amine compounds. These compounds may be used singly or in a form of a suitable mixture of two or more thereof.

Among them, bis(4-maleimidophenyl)methane, 2,2-bis{4-(4-maleimidophenoxy)-phenyl}propane, bis(3-ethyl- 5-methyl-4-maleimidophenyl)methane, or a maleimide compound represented by the following general formula (6) is preferred, and a maleimide compound represented by the following general formula (6) is particularly preferred.

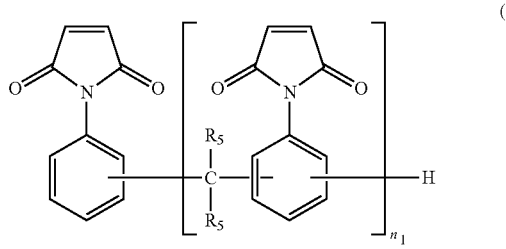

(6)

In the formula (6), each $R_5$ independently represents a hydrogen atom or a methyl group and is particularly preferably a hydrogen atom.

In the formula, $n_1$ represents an integer of 1 or larger. The upper limit of $n_1$ is preferably 10, more preferably 7.

In the resin composition for use in the insulating layer of the present embodiment, the content of the maleimide compound (B) is determined according to the ratio of the number of functional group between the number of alkenyl groups (α) as a functional group in the alkenyl-substituted nadimide (A) and the number of maleimide groups (β) in the maleimide compound (B) ([β/α]) as mentioned later, and is preferably 45 to 70 parts by mass based on 100 parts by mass in total of the components (A) to (C) of the resin composition. The content of the component (B) falls within such a range, whereby the resulting printed circuit board can be excellent in moldability even when packed with a filler, and be excellent in curability, elastic modulus under heat, desmear resistance, and chemical resistance.

In the resin composition for use in the insulating layer of the present embodiment, the contents of the alkenyl-substituted nadimide (A) and the maleimide compound (B) are specified by the ratio between the numbers of their respective designated functional groups. In this context, the designated functional group of the alkenyl-substituted nadimide (A) is alkenyl groups bonded to molecular ends, and the designated functional group of the maleimide compound (B) is maleimide groups.

In the resin composition for use in the insulating layer of the present embodiment, the ratio of the number of maleimide groups (β) in the maleimide compound (B) to the number of alkenyl groups (α) in the alkenyl-substituted nadimide (A) [β/α] is preferably 0.9 to 4.3, more preferably 1.5 to 4.0. The functional group ratio [β/α] falls within such a range, whereby the resulting printed circuit board can be excellent in low thermal expansion, elastic modulus under heat, heat resistance, heat resistance upon moisture-absorbing, desmear resistance, chemical resistance, and easy curability.

Examples of the type of the cyanic acid ester compound (C) used in the present embodiment include, but are not particularly limited to, a naphthol aralkyl-based cyanic acid ester represented by the general formula (7) given below, a novolac-based cyanic acid ester represented by the general formula (8) given below, biphenyl aralkyl-based cyanic acid esters, bis(3,3-dimethyl-4-cyanatophenyl)methane, bis(4-cyanatophenyl)methane, 1,3-dicyanatobenzene, 1,4-dicyanatobenzene, 1,3,5-tricyanatobenzene, 1,3-dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, 4,4'-dicyanatobiphenyl, bis(4-cyanatophenyl) ether, bis(4-cyanatophenyl) thioether, bis(4-cyanatophenyl)sulfone, and 2,2-bis(4-cyanatophenyl) propane.

Among them, a naphthol aralkyl-based cyanic acid ester compound represented by the following general formula (7), a novolac-based cyanic acid ester represented by the following general formula (8), or a biphenyl aralkyl-based cyanic acid ester is particularly preferred because of excellent flame retardancy, high curability, and the low coefficient of thermal expansion of a cured product.

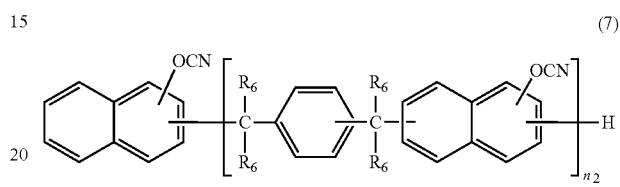

(7)

In the formula (7), each $R_6$ independently represents a hydrogen atom or a methyl group and is particularly preferably a hydrogen atom.

In the formula (7), $n_2$ represents an integer of 1 or larger. The upper limit of $n_2$ is preferably 10, more preferably 6.

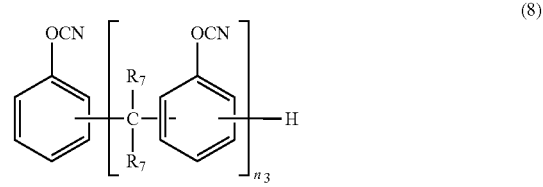

(8)

In the formula (8), each $R_7$ independently represents a hydrogen atom or a methyl group and is particularly preferably a hydrogen atom.

In the formula (8), $n_3$ represents an integer of 1 or larger. The upper limit of $n_3$ is preferably 10, more preferably 7.

Methods for producing these cyanic acid ester compounds are not particularly limited, and the cyanic acid ester compound used in the present embodiment may be produced by any method existing as a cyanic acid ester synthesis method. As a specific example, the cyanic acid ester compound can be obtained by reacting a naphthol aralkyl-based phenol resin represented by the general formula (9) given below with cyanogen halide in the presence of a basic compound in an inert organic solvent. An alternate method that may be adopted involves forming a salt of a similar naphthol aralkyl-based phenol resin and a basic compound in a solution containing water, followed by two-phase interfacial reaction with cyanogen halide for synthesis.

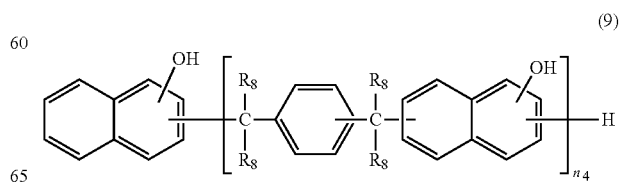

(9)

In the formula (9), each $R_8$ independently represents a hydrogen atom or a methyl group and is particularly preferably a hydrogen atom.

In the formula (9), $n_4$ represents an integer of 1 or larger. The upper limit of $n_4$ is preferably 10, more preferably 6.

The naphthol aralkyl-based cyanic acid ester compound can be selected from those obtained by condensing cyanic acid with a naphthol aralkyl resin obtained through the reaction of a naphthol such as α-naphthol or β-naphthol with p-xylylene glycol, α,α'-dimethoxy-p-xylene, 1,4-di(2-hydroxy-2-propyl)benzene, or the like.

In the resin composition for use in the insulating layer of the present embodiment, the content of the cyanic acid ester compound (C) is preferably 5 to 15 parts by mass based on 100 parts by mass in total of the components (A) to (C). The content of the cyanic acid ester compound (C) falls within such a range, whereby the resulting printed circuit board can be excellent in moldability even when packed with a filler, and be excellent in elastic modulus under heat, desmear resistance, and chemical resistance.

The resin composition for use in the insulating layer of the present embodiment may be supplemented with an additional resin, in addition to the components (A) to (C), without impairing the intended characteristics. The type of the additional resin is not particularly limited as long as the resin has insulating properties. Examples thereof include resins such as epoxy resins, benzoxazine compounds, phenol resins, and thermoplastic resins. Appropriately combined use with these resins can confer characteristics such as metal adhesion and stress-relaxing properties.

The inorganic filler (D) used in the present embodiment is not particularly limited as long as the inorganic filler has insulating properties. Examples thereof include silicas (e.g., natural silica, fused silica, amorphous silica, and hollow silica), alumina, aluminum nitride, boron nitride, boehmite, molybdenum oxide, titanium oxide, silicone rubber, hybrid silicone powder, zinc borate, zinc stannate, clay, kaolin, talc, fired clay, fired kaolin, fired talc, mica, short glass fiber (fine glass powders such as E glass and D glass), hollow glass, and spherical glass. These fillers may be used singly or in a form of a suitable mixture of two or more thereof.

Among them, silica is preferably used from the viewpoint of low thermal expansion. Alumina or aluminum nitride is preferably used from the viewpoint of high thermal conductivity.

In the resin composition for use in the insulating layer of the present embodiment, the content of the inorganic filler (D) is not particularly limited and is preferably 100 to 1000 parts by mass based on 100 parts by mass in total of the components (A) to (C) from the viewpoint of characteristics such as low thermal expansion and high thermal conductivity. Among others, the content of the inorganic filler (D) is particularly preferably 200 to 800 parts by mass.

The resin composition for use in the insulating layer of the present embodiment may be used in combination with a silane coupling agent and/or a wetting dispersant in order to improve the dispersibility of fine particles and the adhesion strength between the resin and the fine particles or glass cloth. The silane coupling agent is not particularly limited as long as the silane coupling agent is generally used in the surface treatment of inorganic matter. Specific examples thereof include: aminosilane derivatives such as γ-aminopropyltriethoxysilane and N-β-(aminoethyl)-γ-aminopropyltrimethoxysilane; epoxysilane derivatives such as γ-glycidoxypropyltrimethoxysilane; acrylsilane derivatives such as γ-acryloxypropyltrimethoxysilane; cationic silane derivatives such as N-β-(N-vinylbenzylaminoethyl)-γ-aminopropyltrimethoxysilane hydrochloride; and phenylsilane derivatives. These silane coupling agents may be used singly or in suitable combinations of two or more thereof. The wetting dispersant is not particularly limited as long as the wetting dispersant is used as a dispersion stabilizer for paint. Examples of the wetting dispersant include DISPER-110, -111, -118, -180, and -161, BYK-W996, -W9010, and -W903 manufactured by BYK Japan K.K.

The resin composition for use in the insulating layer of the present embodiment may be used in combination with a curing accelerator as long as it does not impair intended characteristics. Examples thereof include: organic peroxides such as benzoyl peroxide, lauroyl peroxide, acetyl peroxide, p-chlorobenzoyl peroxide, and di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octoate, tin oleate, dibutyl tin maleate, manganese naphthenate, cobalt naphthenate, and acetyl acetone iron; these organic metal salts dissolved in hydroxy group-containing compounds such as phenol and bisphenol; inorganic metal salts such as tin chloride, zinc chloride, and aluminum chloride; and dioctyl tin oxide and other organic tin compounds such as alkyl tin and alkyl tin oxide.

The resin composition for use in the insulating layer of the present embodiment may further contain a solvent, if necessary. For example, use of an organic solvent reduces viscosity during the preparation of the resin composition and thus improves handleability while enhancing the impregnation of glass cloth with the resin composition. The type of the solvent is not particularly limited as long as the solvent is capable of dissolving a portion or the whole of the resins in the resin composition. Specific examples thereof include, but are not particularly limited to: ketones such as acetone, methyl ethyl ketone, and methylcellosolve; aromatic hydrocarbons such as toluene and xylene; amides such as dimethylformamide; and propylene glycol monomethyl ether and its acetate. These solvents can be used singly or in combinations of two or more thereof.

The resin composition for use in the insulating layer of the present embodiment can be prepared according to a routine method. For example, a preferred method involves obtaining a resin composition homogeneously containing the alkenyl-substituted nadimide (A), the maleimide compound (B), the cyanic acid ester resin (C), and the inorganic filler (D) and other optional components mentioned above. Specifically, for example, the alkenyl-substituted nadimide (A), the maleimide compound (B), the cyanic acid ester resin (C), and the inorganic filler (D) can be sequentially added to the solvent and fully stirred to readily prepare the resin composition for use in the insulating layer of the present embodiment.

An organic solvent can be used, if necessary, in the preparation of the resin composition for use in the insulating layer of the present embodiment. The type of the organic solvent is not particularly limited as long as the solvent is capable of dissolving the resins in the resin composition. Specific examples thereof are as listed above.

Treatment (stirring, mixing, or kneading treatment, etc.) known in the art for uniformly dissolving or dispersing each component can be carried out in the preparation of the resin composition. For example, the inorganic filler (D) can be uniformly dispersed by stirring and dispersion treatment using a stirring vessel equipped with a stirrer having an appropriate stirring ability. This enhances the dispersibility of the inorganic filler (D) in the resin composition. The stirring, mixing, or kneading treatment can be appropriately carried out using an apparatus known in the art such as an apparatus aimed at mixing, for example, a ball mill or a bead mill, or a revolution- or rotation-type mixing apparatus.

Meanwhile, the insulating layer of the present embodiment may be a prepreg comprising a base material impregnated or coated with the resin composition. The prepreg can be obtained, for example, by combining the resin composition with the base material, specifically, impregnating or coating the base material with the resin composition. The method for preparing the prepreg can be carried out according to a routine method without particular limitations. For example, the base material can be impregnated or coated with the resin composition, followed by semi-curing (conversion to B-stage) by heating or the like for 1 to 30 minutes in a drier of 100 to 200° C. to prepare the prepreg. The amount of the resin composition (containing the inorganic filler) in the prepreg of the present embodiment is not particularly limited and is preferably in the range of 30 to 90% by mass based on the total mass of the prepreg.

The base material for use in the prepreg is not particularly limited and can be appropriately selected for use from various printed circuit board materials known in the art according to the intended use or performance. Specific examples thereof include, but are not particularly limited to: glass fibers such as E glass, D glass, S glass, Q glass, spherical glass, NE glass, and T glass; non-glass inorganic fibers such as quartz; wholly aromatic polyamides such as poly-p-phenyleneterephthalamide (Kevlar®, manufactured by Du Pont K.K.) and co-poly-p-phenylene/3,4'-oxydiphenylene/terephthalamide (Technora®, manufactured by Teijin Techno Products, Ltd.); polyesters such as 2,6-hydroxynaphthoic acid/p-hydroxybenzoic acid (Vectran®, manufactured by Kuraray Co., Ltd.); and organic fibers such as poly-p-phenylene benzoxazole (Zylon®, manufactured by Toyobo Co., Ltd.) and polyimide.

Among them, E glass cloth, T glass cloth, S glass cloth, Q glass cloth, or an organic fiber is preferred from the viewpoint of low thermal expansion.

These base materials can be used singly or in combinations of two or more thereof.

Examples of the form of the base material include, but are not particularly limited to, woven fabrics, nonwoven fabrics, lobings, chopped strand mats, and surfacing mats. The textures of the woven fabrics are not particularly limited, and, for example, plain weave, mat weave, and twill weave are known. The base material can be appropriately selected for use from these materials known in the art according to the intended use or performance. Such a base material subjected to opening treatment or a glass woven fabric surface-treated with a silane coupling agent or the like is preferably used. The base material is not particularly limited by its thickness and mass. Usually, the base material of approximately 0.01 to 0.3 mm is preferably used. In particular, the base material is preferably a glass woven fabric having a thickness of 200 μm or smaller and a mass of 250 g/m² or smaller, more preferably a glass woven fabric made of E glass, S glass, or T glass fiber, from the viewpoint of strength and water absorbability.

Meanwhile, the insulating layer of the present embodiment may be a laminate obtained by curing one or more layers of a prepreg and is preferably a metal foil-clad laminate obtained by curing a metal foil laminated with a prepreg. The metal foil-clad laminate can be obtained, for example, by providing at least one or more layers of the prepreg mentioned above and disposing the metal foil on one side or both sides thereof, followed by lamination molding. Specifically, the metal foil-clad laminate can be prepared by providing one layer or two or more layers of the prepreg mentioned above, disposing the metal (e.g., copper or aluminum) foil on one side or both sides thereof as desired, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The thickness of the metal foil is not particularly limited and is preferably 1 to 70 μm more preferably 1.5 to 35 μm. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm² in terms of surface pressure for a heating time in the range of 0.05 to 5 hours. If necessary, post curing may be further carried out at a temperature of 150 to 300° C. Alternatively, the prepreg mentioned above may be lamination-molded in combination with a separately prepared wiring board for an inner layer to obtain a multilayer board.

The metal foil-clad laminate described above can be preferably used as a printed circuit board by forming a predetermined wiring pattern. The metal foil-clad laminate has a low coefficient of thermal expansion and favorable moldability and chemical resistance and can thus be used particularly effectively as a printed circuit board for semiconductor packages required to have such performance.

The insulating layer of the present embodiment can be used in the form of the prepreg mentioned above as well as in the form of an embedded sheet comprising a metal foil or a film coated with the resin composition.

The insulating layer of the present embodiment may be a resin sheet comprising a support coated on one side or both sides with the resin composition. The resin sheet is used as an approach for thinning and can be produced, for example, by directly coating a support such as a metal foil or a film with a thermosetting resin (containing an inorganic filler) for use in prepregs, etc., followed by drying.

The support for use in the production of the resin sheet is not particularly limited, and any of various printed circuit board materials known in the art can be used. Examples thereof include polyimide films, polyamide films, polyester films, polyethylene terephthalate (PET) films, polybutylene terephthalate (PBT) films, polypropylene (PP) films, polyethylene (PE) films, aluminum foils, copper foils, and gold foils. Among them, an electrolytic copper foil or a PET film is preferred.

The resin sheet is particularly preferably a product obtained by coating the support with the aforementioned resin composition containing the alkenyl-substituted nadimide (A), the maleimide compound (B), the cyanic acid ester compound (C), and the inorganic filler (D), followed by semi-curing (conversion to B-stage). The method for producing this resin sheet is generally preferably a method for producing a composite of a B-stage resin and a support. Specific examples thereof include a method which involves coating the support such as a copper foil with the resin composition, followed by semi-curing by a method such as heating for 1 to 60 minutes in a drier of 100 to 200° C. to produce the resin sheet. The amount of the resin composition applied to the support is preferably in the range of 1 to 300 µm in terms of the resin thickness of the resin sheet.

The insulating layer of the present embodiment may be a laminate obtained by curing one or more layers of a resin sheet and is preferably a metal foil-clad laminate obtained by curing a metal foil laminated with a resin sheet. The metal foil-clad laminate can be obtained, for example, by using the resin sheet mentioned above and disposing the metal foil on one side or both sides thereof, followed by lamination molding. The metal foil-clad laminate can be prepared, for example, by providing one layer of the resin sheet mentioned above or two or more layers of the resin sheet separated from its support as desired, disposing the metal (e.g., copper or aluminum) foil on one side or both sides thereof, and lamination-molding this construct according to the need. In this context, the metal foil used is not particularly limited as long as the metal foil can be used as a printed circuit board material. A copper foil known in the art such as a rolled copper foil or an electrolytic copper foil is preferred. The metal foil-clad laminate is not particularly limited by its molding method and molding conditions and can be molded by use of a general approach and conditions for laminates for printed circuit boards and multilayer boards. For example, a multiplaten press, a multiplaten vacuum press, a continuous molding machine, or an autoclave molding machine can be used in the molding of the metal foil-clad laminate. The metal foil-clad laminate is generally molded at a temperature of 100 to 300° C. and a pressure of 2 to 100 kgf/cm$^2$ in terms of surface pressure for a heating time in the range of 0.05 to 5 hours. If necessary, post curing may be further carried out at a temperature of 150 to 300° C.

The resin sheet can be used as a buildup material for printed circuit boards.

Alternatively, the insulating layer of the present embodiment may be a laminate obtained by curing one or more layers of a resin sheet and one or more layers of a prepreg or may be a metal foil-clad laminate obtained by curing a metal foil laminated with a resin sheet and a prepreg.

When the insulating layer of the present embodiment is not in the form of a metal foil-clad laminate, an electroless plating approach may be used for forming a conductor layer that serves as a circuit and preparing a printed circuit board.

The printed circuit board of the present embodiment is a printed circuit board comprising the insulating layer mentioned above and is preferably a printed circuit board comprising, for example, the insulating layer mentioned above and a conductor layer formed on the surface of the insulating layer.

The printed circuit board of the present embodiment is prepared, for example, by forming a conductor layer that serves as a circuit by use of a metal foil or electroless plating on the insulating layer mentioned above. The conductor layer is generally constituted by copper or aluminum. The insulating layer for printed circuit boards with the conductor layer formed thereon can be preferably used as a printed circuit board by forming a predetermined wiring pattern. In addition, the printed circuit board of the present embodiment can be particularly effectively used as a printed circuit board for semiconductor packages, because the insulating layer mentioned above maintains the excellent elastic modulus even at a reflow temperature during semiconductor packaging and thereby effectively suppresses the warpage of semiconductor plastic packages.

Specifically, the printed circuit board of the present embodiment can be produced by, for example, the following method: first, the metal foil-clad laminate (copper-clad laminate, etc.) mentioned above is prepared. The surface of the metal foil-clad laminate is subjected to etching treatment for the formation of an inner layer circuit to prepare an inner layer substrate. The inner layer circuit surface of this inner layer substrate is subjected, if necessary, to surface treatment for enhancing adhesion strength. Subsequently, a required number of the prepreg mentioned above is laminated on the resulting inner layer circuit surface. A metal foil for an outer layer circuit is laterally laminated thereon, followed by integral molding under heat and pressure. In this way, a multilayer laminate is produced in which the insulating layer composed of the base material and a cured product of thermosetting resin composition is formed between the inner layer circuit and the metal foil for an outer layer circuit. Subsequently, this multilayer laminate is processed by hole drilling for through-holes or via holes and then subjected to desmear treatment for removing smear, which is a residue of resins derived from the resin components contained in the cured product layer. Then, the inside walls of these holes are coated with a metal plating film for the community between the inner layer circuit and the metal foil for an outer layer circuit. The metal foil for an outer layer circuit is further subjected to etching treatment for the formation of the outer layer circuit to produce the printed circuit board.

For example, the prepreg mentioned above (base material impregnated with the resin composition mentioned above) or the resin composition layer of the metal foil-clad laminate (layer composed of the resin composition mentioned above) constitutes the insulating layer comprising the resin composition mentioned above.

Hereinafter, the present invention will be specifically described with reference to Examples and Comparative Examples. However, the present invention is not intended to be limited by these Examples by any means.

EXAMPLES

Example 1

10 parts by mass of an α-naphthol aralkyl-based cyanic acid ester resin (manufactured by Mitsubishi Gas Chemical Co., Inc.), 55 parts by mass of a maleimide compound (BMI-2300, manufactured by Daiwa Fine Chemicals Co., Ltd.), and 35 parts by mass of bisallylnadimide (BANI-M, manufactured by Maruzen Petrochemical Co., Ltd.) were mixed with 150 parts by mass of slurry silica (SC-5050MOB, average particle size: 1.5 µm, manufactured by Admatechs Co., Ltd.), 1 part by mass of a wetting dispersant (DISPERBYK-161, manufactured by BYK Japan K.K.), and 1 part by mass of a silane coupling agent (Z6040, manufactured by Dow Corning Toray Co., Ltd.), and this mixture was diluted with methyl ethyl ketone to obtain varnish. An E glass woven fabric was impregnated and coated with this varnish, and dried by heating at 160° C. for 3 minutes to obtain a prepreg having a resin composition content of 46% by mass. In this point, the ratio of the number of maleimide groups (β) in the maleimide compound (B) to the number of alkenyl groups (α) in the alkenyl-substituted nadimide (A) [β/α] was 2.42. The ratio [β/α] is represented by the following expression:

[β/α]=(Parts by mass of (B)/Functional group equivalent of (B))/(Parts by mass of (A)/Functional group equivalent of (A))

The obtained prepreg had no glass transition temperature (Tg) in a region of 400° C. or lower.

Example 2

10 parts by mass of an α-naphthol aralkyl-based cyanic acid ester resin (manufactured by Mitsubishi Gas Chemical Co., Inc.), 65 parts by mass of a maleimide compound (BMI-2300, manufactured by Daiwa Fine Chemicals Co., Ltd.), and 25 parts by mass of bisallylnadimide (BANI-M, manufactured by Maruzen Petrochemical Co., Ltd.) were mixed with 150 parts by mass of slurry silica (SC-5050MOB, average particle size: 1.5 μm, manufactured by Admatechs Co., Ltd.), 1 part by mass of a wetting dispersant (DISPERBYK-161, manufactured by BYK Japan K.K.), and 1 part by mass of a silane coupling agent (Z6040, manufactured by Dow Corning Toray Co., Ltd.), and this mixture was diluted with methyl ethyl ketone to obtain varnish. An E glass woven fabric was impregnated and coated with this varnish, and dried by heating at 160° C. for 3 minutes to obtain a prepreg having a resin composition content of 46% by mass. In this point, the ratio of the number of maleimide groups (β) in the maleimide compound (B) to the number of alkenyl groups (α) in the alkenyl-substituted nadimide (A) [β/α] was 4.00. The obtained prepreg had no glass transition temperature (Tg) in a region of 400° C. or lower.

Comparative Example 1

35 parts by mass of an α-naphthol aralkyl-based cyanic acid ester resin (manufactured by Mitsubishi Gas Chemical Co., Inc.), 30 parts by mass of a maleimide compound (BMI-2300, manufactured by Daiwa Fine Chemicals Co., Ltd.), and 35 parts by mass of a naphthylene ether-based epoxy resin (HP-6000, manufactured by DIC Corp.) were mixed with 150 parts by mass of slurry silica (SC-5050MOB, average particle size: 1.5 μm, manufactured by Admatechs Co., Ltd.), 1 part by mass of a wetting dispersant (DISPERBYK-161, manufactured by BYK Japan K.K.), and 1 part by mass of a silane coupling agent (Z6040, manufactured by Dow Corning Toray Co., Ltd.), and this mixture was diluted with methyl ethyl ketone to obtain varnish. An E glass woven fabric was impregnated and coated with this varnish, and dried by heating at 160° C. for 3 minutes to obtain a prepreg having a resin composition content of 46% by mass.

Comparative Example 2

35 parts by mass of an α-naphthol aralkyl-based cyanic acid ester resin (manufactured by Mitsubishi Gas Chemical Co., Inc.), 35 parts by mass of a maleimide compound (BMI-2300, manufactured by Daiwa Fine Chemicals Co., Ltd.), 25 parts by mass of a phenol novolac epoxy resin(N-770, manufactured by DIC Corp.), and 5 parts by mass of a naphthylmethane-based epoxy resin (HP-4710, manufactured by DIC Corp.) were mixed with 150 parts by mass of slurry silica (SC-5050MOB, average particle size: 1.5 μm, manufactured by Admatechs Co., Ltd.), 1 part by mass of a wetting dispersant (DISPERBYK-161, manufactured by BYK Japan K.K.), and 1 part by mass of a silane coupling agent (Z6040, manufactured by Dow Corning Toray Co., Ltd.), and this mixture was diluted with methyl ethyl ketone to obtain varnish. An E glass woven fabric was impregnated and coated with this varnish, and dried by heating at 160° C. for 3 minutes to obtain a prepreg having a resin composition content of 46% by mass.

Comparative Example 3

35 parts by mass of an α-naphthol aralkyl-based cyanic acid ester resin (manufactured by Mitsubishi Gas Chemical Co., Inc.), 40 parts by mass of a maleimide compound (BMI-2300, manufactured by Daiwa Fine Chemicals Co., Ltd.), 10 parts by mass of a naphthylene ether-based epoxy resin (HP-4710, manufactured by DIC Corp.), 5 parts by mass of a naphthylmethane-based epoxy resin (HP-4710, manufactured by DIC Corp.), and 10 parts by mass of bisallylnadimide (BANI-M, manufactured by Maruzen Petrochemical Co., Ltd.) were mixed with 150 parts by mass of slurry silica (SC-5050MOB, average particle size: 1.5 μm, manufactured by Admatechs Co., Ltd.), 1 part by mass of a wetting dispersant (DISPERBYK-161, manufactured by BYK Japan K.K.), and 1 part by mass of a silane coupling agent (Z6040, manufactured by Dow Corning Toray Co., Ltd.), and this mixture was diluted with methyl ethyl ketone to obtain varnish. An E glass woven fabric was impregnated and coated with this varnish, and dried by heating at 160° C. for 3 minutes to obtain a prepreg having a resin composition content of 46% by mass. In this respect, the ratio of the number of maleimide groups (β) in the maleimide compound (B) to the number of alkenyl groups (α) in the alkenyl-substituted nadimide (A) [β/α] was 6.15.

Preparation of Metal Foil-clad Laminate

Electrolytic copper foils having a thickness of 12 μm (3EC-III, manufactured by Mitsui Mining & Smelting Co., Ltd.) were disposed on the upper and lower sides of 1 layer or 8 layers of the prepreg obtained in each of Examples 1 and 2 and Comparative Examples 1 to 3, and the resultant was lamination-molded at a pressure of 30 kgf/cm$^2$ and a temperature of 220° C. for 120 minutes to obtain a copper-clad laminate having an insulating layer thickness of 0.1 mm or 0.8 mm.

Results of measuring a coefficient of linear thermal expansion and a flexural modulus using each obtained copper-clad laminate are shown in Table 1.

Method for Evaluating Physical Properties of Copper-clad Laminate

Coefficient of linear thermal expansion: after removal of the copper foils from each copper-clad laminate by etching, the resulting sample was heated from 40° C. to 340° C. at a rate of 10° C./min in a thermomechanical analysis apparatus (manufactured by TA Instruments) to measure the coefficient of linear thermal expansion in the planar direction at from 60° C. to 120° C. The direction of the measurement was set to the longitudinal direction (Warp) of the glass cloth of the laminate.

Flexural modulus: a 50 mm×25 mm×0.8 mm sample was used. Its flexural modulus was measured at each of 25° C. and 250° C. using an autograph (AG-Xplus manufactured by Shimadzu Corp.) according to JIS C6481.

Rate of elastic modulus loss: the difference between the flexural modulus (a) at 25° C. and the elastic modulus (b) as the flexural modulus under heat at 250° C. measured by the approach described above was calculated according to the following expression:

$$\text{Rate of elastic modulus loss} = \{(a)-(b)\}/(a) \times 100$$

Warpage evaluation: the amount of warpage in a substrate was evaluated by the shadow moire analysis using Ther- Moire PS200L manufactured by Akrometrix, Inc. The sample size of the substrate was set to 40 mm×40 mm, and the measurement area was set to 36 mm×36 mm. The substrate sample was heated from room temperature to 260° C. and then cooled to 50° C. The resulting amount of warpage was measured. A sample improved in warpage by 15% or more as compared with Comparative Example 1 was defined as ○, and a sample improved in warpage by 5% or more and less than 15% as compared with Comparative Example 1 was defined as Δ.

TABLE 1

|  |  |  | Example 1 | Example 2 | Comparative Example 1 | Comparative Example 2 | Comparative Example 3 |
|---|---|---|---|---|---|---|---|
| Coefficient of linear thermal expansion | TMA | [ppm] | 7 | 7 | 7 | 7 | 7 |
| Flexural modulus | 25° C. | [GPa] | 33 | 33 | 34 | 34 | 34 |
|  | 250° C. | [GPa] | 29 | 27 | 22 | 24 | 25 |
| Rate of elastic modulus loss |  | [%] | 12 | 18 | 35 | 29 | 26 |
| Amount of warpage | 25° C.- 260° C. | [μm] | 40 | 41 | 50 | 47 | 46 |
|  |  | Evaluation | ○ | ○ | X | Δ | Δ |

Synthesis Example 1 Synthesis of α-naphthol aralkyl-based cyanic acid ester resin A reactor equipped with a thermometer, a stirrer, a dropping funnel, and a reflux condenser was cooled to 0 to 5° C. in advance using brine and charged with 7.47 g (0.122 mol) of cyanogen chloride, 9.75 g (0.0935 mol) of 35% hydrochloric acid, 76 ml of water, and 44 ml of methylene chloride.

While the temperature and pH of this reactor were kept at −5 to +5° C. and 1 or lower, respectively, a solution containing 20 g (0.0935 mol) of an α-naphthol aralkyl-based phenol resin of the formula (9) wherein all of the $R_8$ moieties were hydrogen atoms (SN485, OH group equivalent: 214 g/eq., softening point: 86° C., manufactured by Nippon Steel & Sumikin Chemical Co., Ltd.), and 14.16 g (0.14 mol) of triethylamine dissolved in 92 ml of methylene chloride was added dropwise over 1 hour through the dropping funnel with stirring. After the completion of the dropwise addition, 4.72 g (0.047 mol) of triethylamine was further added dropwise thereto over 15 minutes.

After the completion of the dropwise addition, the mixture was stirred at the same temperature as above for 15 minutes. Then, the reaction solution was separated into organic and aqueous layers, and the organic layer was separated. The obtained organic layer was washed with 100 ml of water twice. Then, methylene chloride was distilled off under reduced pressure with an evaporator, and the residue was finally concentrated to dryness at 80° C. for 1 hour to obtain 23.5 g of a cyanic acid esterified product of the α-naphthol aralkyl-based phenol resin (α-naphthol aralkyl-based cyanic acid ester resin).

Example 3

10 parts by mass of the α-naphthol aralkyl-based cyanic acid ester resin (cyanate equivalent: 261 g/eq.) obtained in Synthesis Example 1, 35 parts by mass of a maleimide compound of the formula (6) wherein all of the $R_5$ moieties were hydrogen atoms, and $n_1$ was 1 to 3 (BMI-2300, manufactured by Daiwa Fine Chemicals Co., Ltd.), 55 parts by mass of an alkenyl-substituted nadimide compound represented by the formula (4) (BANI-M, manufactured by Maruzen Petrochemical Co., Ltd.), 100 parts by mass of slurry silica (SC-5050MOB, average particle size: 1.5 μm, manufactured by Admatechs Co., Ltd.), 1 part by mass of a wetting dispersant (DISPERBYK-161, manufactured by BYK Japan K.K.), and 5 parts by mass of a silane coupling agent (Z6040, manufactured by Dow Corning Toray Co., Ltd.) were mixed to obtain varnish. This varnish was diluted with methyl ethyl ketone. An E glass woven fabric was impregnated and coated with the diluted varnish, and dried by heating at 140° C. for 3 minutes to obtain a prepreg having a resin composition content of 44% by mass. In this point, the ratio of the number of maleimide groups (β) in the maleimide compound (B) to the number of alkenyl groups (α) in the alkenyl-substituted nadimide (A) [β/α] was 0.98. The ratio [β/α] is represented by the following expression:

[β/α]=(Parts by mass of (B)/Functional group equivalent of (B))/(Parts by mass of (A)/Functional group equivalent of (A))

The obtained prepreg had no glass transition temperature (Tg) in a region of 400° C. or lower.

Example 4

A prepreg was obtained in the same way as in Example 3 except that the amounts of the maleimide compound (BMI-2300) and the alkenyl-substituted nadimide (BANI-M) used in Example 3 were set to 65 parts by mass and 25 parts by mass, respectively. In this point, the ratio of the number of maleimide groups (β) in the maleimide compound (B) to the number of alkenyl groups (α) in the alkenyl-substituted nadimide (A) [β/α] was 4.00. The obtained prepreg had no glass transition temperature (Tg) in a region of 400° C. or lower.

Example 5

A prepreg was obtained in the same way as in Example 3 except that the amounts of the maleimide compound (BMI-2300) and the alkenyl-substituted nadimide (BANI-M) used in Example 3 were set to 55 parts by mass and 35 parts by mass, respectively. In this point, the ratio of the number of maleimide groups (β) in the maleimide compound (B) to the number of alkenyl groups (α) in the alkenyl-substituted nadimide (A) [β/α] was 2.42. The obtained prepreg had no glass transition temperature (Tg) in a region of 400° C. or lower.

Example 6

A prepreg was obtained in the same way as in Example 3 except that the amounts of the maleimide compound (BMI- 2300) and the alkenyl-substituted nadimide (BANI-M) used in Example 3 were set to 45 parts by mass and 45 parts by mass, respectively. In this point, the ratio of the number of maleimide groups (b) in the maleimide compound (B) to the number of alkenyl groups (a) in the alkenyl-substituted nadimide (A) [b/a] was 1.54. The obtained prepreg had no glass transition temperature (Tg) in a region of 400° C. or lower.

Example 7

A prepreg was obtained in the same way as in Example 3 except that the amounts of the α-naphthol aralkyl-based cyanic acid ester resin and the maleimide compound (BMI-2300) used in Example 3 were set to 11 parts by mass and 47 parts by mass, respectively, and 42 parts by mass of an alkenyl-substituted nadimide compound represented by the formula (5) (BANI-X, manufactured by Maruzen Petrochemical Co., Ltd.) were used instead of the alkenyl-substituted nadimide compound (BANI-M) represented by the formula (4). In this point, the ratio of the number of maleimide groups (β) in the maleimide compound (B) to the number of alkenyl groups (α) in the alkenyl-substituted nadimide (A) [β/α] was 1.53. The obtained prepreg had no glass transition temperature (Tg) in a region of 400° C. or lower.

Example 8

A prepreg was obtained in the same way as in Example 3 except that the α-naphthol aralkyl-based cyanic acid ester resin used in Example 3 was not used, and the amounts of the maleimide compound (BMI-2300) and the alkenyl-substituted nadimide (BANI-M) used were set to 50 parts by mass and 50 parts by mass, respectively. In this point, the ratio of the number of maleimide groups (β) in the maleimide compound (B) to the number of alkenyl groups (α) in the alkenyl-substituted nadimide (A) [β/α] was 1.54. The obtained prepreg had no glass transition temperature (Tg) in a region of 400° C. or lower.

Comparative Example 4

A prepreg was obtained in the same way as in Example 3 except that the amount of the α-naphthol aralkyl-based cyanic acid ester resin used in Example 3 was set to 30 parts by mass, and the amounts of the maleimide compound (BMI-2300) and the alkenyl-substituted nadimide (BANI-M) used were set to 55 parts by mass and 15 parts by mass, respectively. In this point, the ratio of the number of maleimide groups (β) in the maleimide compound (B) to the number of alkenyl groups (α) in the alkenyl-substituted nadimide (A) [β/α] was 5.64.

Comparative Example 5

A prepreg was obtained in the same way as in Example 3 except that the amount of the α-naphthol aralkyl-based cyanic acid ester resin used in Example 3 was set to 25 parts by mass, and the amounts of the maleimide compound (BMI-2300) and the alkenyl-substituted nadimide (BANI-M) used were set to 55 parts by mass and 20 parts by mass, respectively. In this point, the ratio of the number of maleimide groups (β) in the maleimide compound (B) to the number of alkenyl groups (α) in the alkenyl-substituted nadimide (A) [β/α] was 4.23.

Example 9

A prepreg was obtained in the same way as in Example 3 except that the amount of the α-naphthol aralkyl-based cyanic acid ester resin used in Example 3 was set to 20 parts by mass, and the amounts of the maleimide compound (BMI-2300) and the alkenyl-substituted nadimide (BANI-M) used were set to 55 parts by mass and 25 parts by mass, respectively. In this point, the ratio of the number of maleimide groups (β) in the maleimide compound (B) to the number of alkenyl groups (α) in the alkenyl-substituted nadimide (A) [β/α] was 3.38. The obtained prepreg had no glass transition temperature (Tg) in a region of 400° C. or lower.

Comparative Example 6

A prepreg was obtained in the same way as in Example 3 except that the amount of the α-naphthol aralkyl-based cyanic acid ester resin used in Example 3 was set to 30 parts by mass, and the amounts of the maleimide compound. (BMI-2300) and the alkenyl-substituted nadimide (BANI-M) used were set to 45 parts by mass and 25 parts by mass, respectively. In this point, the ratio of the number of maleimide groups (β) in the maleimide compound (B) to the number of alkenyl groups (α) in the alkenyl-substituted nadimide (A) [β/α] was 2.77.

Comparative Example 7

A prepreg was obtained in the same way as in Example 3 except that the amount of the α-naphthol aralkyl-based cyanic acid ester resin used in Example 3 was set to 20 parts by mass, and the amounts of the maleimide compound (BMI-2300) and the alkenyl-substituted nadimide (BANI-M) used were set to 45 parts by mass and 35 parts by mass, respectively. In this point, the ratio of the number of maleimide groups (β) in the maleimide compound (B) to the number of alkenyl groups (α) in the alkenyl-substituted nadimide (A) [β/α] was 1.98.

Comparative Example 8

A prepreg was obtained in the same way as in Example 3 except that the amount of the α-naphthol aralkyl-based cyanic acid ester resin used in Example 3 was set to 10 parts by mass, and the amounts of the maleimide compound (BMI-2300) and the alkenyl-substituted nadimide (BANI-M) used were set to 35 parts by mass and 65 parts by mass, respectively. In this point, the ratio of the number of maleimide groups (β) in the maleimide compound (B) to the number of alkenyl groups (α) in the alkenyl-substituted nadimide (A) [β/α] was 0.83.

Preparation of Metal Foil-clad Laminate

Electrolytic copper foils having a thickness of 12 μm (3EC-III, manufactured by Mitsui Mining & Smelting Co., Ltd.) were disposed on the upper and lower sides of 1 layer, 4 layers, or 8 layers of the prepreg obtained in each of Examples 3 to 9 and Comparative Examples 4 to 8, and the resultant was lamination-molded at a pressure of 30 kgf/cm$^2$ and a temperature of 220° C. for 12.0 minutes to obtain a copper-clad laminate having an insulating layer thickness of 0.1 mm, 0.4 mm, or 0.8 mm.

Results of evaluating moldability, chemical resistance, desmear resistance, and a flexural modulus using each obtained copper-clad laminate are shown in Tables 2 and 3.

Method for Evaluating Physical Properties of Metal Foil-clad Laminate

Moldability: after removal of the copper foils from each copper-clad laminate by etching, the surfaces were observed to evaluate the presence or absence of voids.

○: Favorable appearance without voids, ×: Voids were present.

Chemical resistance: a 50 mm×50 mm×0.4 mm sample was dipped for 2 hours in an aqueous sodium hydroxide solution of 70° C. adjusted to 1 N and dried. Then, the amount of decrease in weight (% by mass) was measured. A sample having a rate of decrease in weight of −0.2% or less was defined as ⊚, a sample having a rate of decrease in weight larger than −0.2% and −0.3% or less was defined as ○, and a sample having a rate of decrease in weight larger than −0.3% was defined as ×.

Desmear resistance: in order to evaluate chemical resistance in the desmear step, the copper foils were removed from each copper-clad laminate by etching. Then, the resulting sample was dipped in Swelling Dip Securiganth P manufactured by Atotech Japan K.K. as a swelling solution at 80° C. for 10 minutes, then dipped in Concentrate Compact CP manufactured by Atotech Japan K.K. as a roughening solution at 80° C. for 5 minutes, and finally dipped in Reduction Conditioner Securiganth P500 manufactured by Atotech Japan K.K. as a neutralizing solution at 45° C. for 10 minutes. This treatment was carried out three times. Then, the amount of decrease in mass (% by mass) was evaluated. A sample having a rate of decrease in weight of −0.3% or less was defined as ⊚, a sample having a rate of decrease in weight larger than −0.3% and −0.5% or less was defined as ○, and a sample having a rate of decrease in weight larger than −0.5% was defined as ×.

Flexural modulus: a 50 mm×25 mm×0.8 mm sample was used. Its flexural modulus was measured at each of 25° C. and 250° C. using an autograph (AG-Xplus manufactured by Shimadzu Corp.) according to JIS C6481.

Rate of elastic modulus loss: the difference between the flexural modulus (a) at 25° C. and the elastic modulus (b) as the flexural modulus under heat at 250° C. measured by the approach described above was calculated according to the following expression:

Rate of elastic modulus loss=$\{(a)-(b)\}/(a) \times 100$

A sample having a rate of elastic modulus loss larger than 20% was defined as ×, a sample having a rate of elastic modulus loss of 20% or more and 10% or less was defined as ○, and a sample having a rate of elastic modulus loss less than 10% was defined as ⊚.

TABLE 2

|  |  | Example 3 | Example 4 | Example 5 | Example 6 | Example 7 |
|---|---|---|---|---|---|---|
| Cyanic acid ester compound | [parts by mass] | 10 | 10 | 10 | 10 | 11 |
| Functional group ratio | [β/α] | 0.98 | 4.00 | 2.42 | 1.54 | 1.53 |
| Moldability | Evaluation | ○ | ○ | ○ | ○ | ○ |
| Chemical resistance | [%] | −0.25 | −0.1 | −0.19 | −0.2 | −0.19 |
| | Evaluation | ○ | ⊚ | ⊚ | ⊚ | ⊚ |
| Desmear resistance | [%] | −0.31 | −0.47 | −0.46 | −0.28 | −0.27 |
| | Evaluation | ○ | ○ | ○ | ⊚ | ⊚ |
| Flexural modulus at 25° C. | [GPa] | 30 | 32 | 32 | 31 | 32 |
| Flexural modulus at 250° C. | [GPa] | 26 | 28 | 29 | 29 | 29 |
| Rate of elastic modulus loss | [%] | 13 | 13 | 9 | 6 | 9 |
| | Evaluation | ○ | ○ | ⊚ | ⊚ | ⊚ |

TABLE 3

|  |  | Example 8 | Comparative Example 4 | Comparative Example 5 | Example 9 | Comparative Example 6 | Comparative Example 7 | Comparative Example 8 |
|---|---|---|---|---|---|---|---|---|
| Cyanic acid ester compound | [parts by mass] | 0 | 30 | 25 | 20 | 30 | 20 | 10 |
| Functional group ratio | [β/α] | 1.54 | 5.64 | 4.23 | 3.38 | 2.77 | 1.98 | 0.83 |
| Moldability | Evaluation | X | ○ | ○ | ○ | ○ | ○ | ○ |
| Chemical resistance | [%] | −0.17 | −0.15 | −0.2 | −0.13 | −0.13 | −0.23 | −0.35 |
| | Evaluation | ⊚ | ⊚ | ⊚ | ⊚ | ⊚ | ○ | X |
| Desmear resistance | [%] | −0.25 | −0.64 | −0.71 | −0.54 | −0.54 | −0.46 | −0.4 |
| | Evaluation | ⊚ | X | X | X | X | ○ | ○ |
| Flexural modulus at 25° C. | [GPa] | 30 | 34 | 34 | 31 | 32 | 35 | 31 |
| Flexural modulus at 250° C. | [GPa] | 28 | 24 | 27 | 25 | 24 | 27 | 20 |
| Rate of elastic modulus loss | [%] | 7 | 29 | 21 | 19 | 25 | 23 | 35 |
| | Evaluation | ⊚ | X | X | ○ | X | X | X |

INDUSTRIAL APPLICABILITY

According to the present invention, a semiconductor plastic package that has a little warpage and is excellent in production yields and reliability can be produced by factors different from conventional ones.

The invention claimed is:

1. A resin composition comprising an alkenyl-substituted nadimide (A), a maleimide compound (B), a cyanic acid ester compound (C), and an inorganic filler (D), wherein the cyanic acid ester compound (C) is 5 to 15 parts by mass based on 100 parts by mass in total of the components (A) to (C), and a ratio of the number of a maleimide groups (β) in the maleimide compound (B) to the number of an alkenyl groups (α) in the alkenyl-substituted nadimide (A) [β/α] is 0.9 to 4.3.

2. The resin composition according to claim 1, wherein a rate of elastic modulus loss calculated by the following formula which is a difference between a flexural modulus (a) at 25° C. and a flexural modulus under heat (b) at 250° C. is 20% or less:

rate of elastic modulus loss={(a)−(b)}/(a)×100 wherein the flexural modulus (a) at 25° C. and the flexural modulus under heat (b) at 250° C. are values measured at 25° C. and 250° C. respectively according to JIS C6481 using a 50 mm×25 mm×0.8 mm sample, and the sample is a copper-clad laminate having an insulating layer thickness of 0.8 mm obtained by that an E glass woven fabric is impregnated and coated with the resin composition and dried by heating at 160° C. for 3 minutes to obtain a prepreg, electrolytic copper foils having a thickness of 12 μm are disposed on upper and lower sides of 8 layers of the prepreg to obtain a resultant, and the resultant is lamination-molded at a pressure of 30 kgf/cm² and a temperature of 220° C. for 120 minutes.

3. The resin composition according to claim 1, wherein the alkenyl-substituted nadimide (A) is a compound represented by the following formula (1):

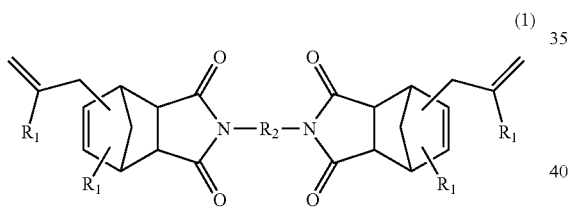

(1)

wherein each $R_1$ independently represents a hydrogen atom or an alkyl group having 1 to 6 carbon atoms, and $R_2$ represents an alkylene group having 1 to 6 carbon atoms, a phenylene group, a biphenylene group, a naphthylene group, or a group represented by the following formula (2) or (3):

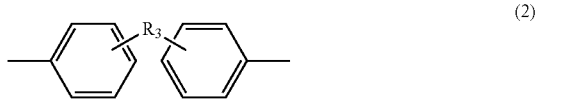

(2)

wherein $R_3$ represents a methylene group, an isopropylidene group, or a substituent represented by CO, O, S, or SO₂, and

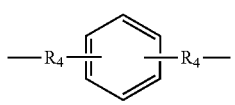

(3)

wherein each $R_4$ independently represents an alkylene group having 1 to 4 carbon atoms, or a cycloalkylene group having 5 to 8 carbon atoms.

4. The resin composition according to claim 1, wherein the alkenyl-substituted nadimide (A) is a compound represented by the following formula (4) and/or (5):

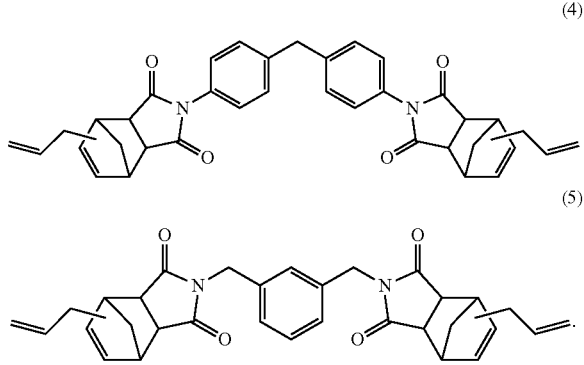

5. The resin composition according to claim 1, wherein the maleimide compound (B) is at least one compound selected from the group consisting of bis(4-maleimidophenyl)methane, 2,2-bis{4-(4-maleimidophenoxy)-phenyl}propane, bis(3-ethyl-5-methyl-4-maleimidophenyl)methane and a maleimide compound represented by the following formula (6):

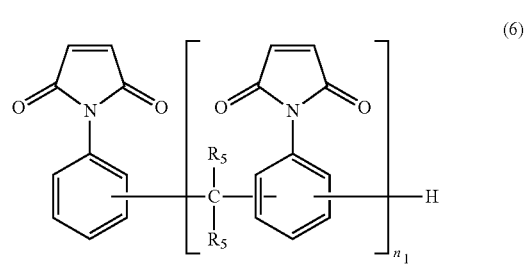

wherein each $R_5$ independently represents a hydrogen atom or a methyl group, and $n_1$ represents an integer of 1 or larger.

6. The resin composition according to claim 1, wherein the cyanic acid ester compound (C) is a compound represented by the following formula (7) and/or (8):

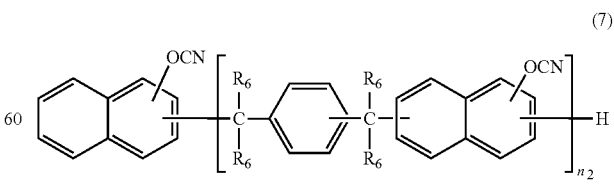

wherein each $R_6$ independently represents a hydrogen atom or a methyl group, and $n_2$ represents an integer of 1 or larger, and

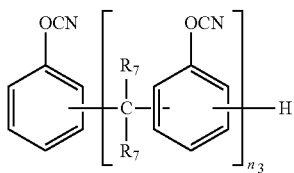

(8)

wherein each $R_7$ independently represents a hydrogen atom or a methyl group, and $n_3$ represents an integer of 1 or larger.

7. The resin composition according to claim 1, wherein the inorganic filler (D) is at least one material selected from the group consisting of silica, alumina, and aluminum nitride.

8. The resin composition according to claim 1, wherein a content of the inorganic filler (D) is 100 to 1000 parts by mass based on 100 parts by mass in total of the components (A) to (C).

9. An insulating layer for a printed circuit board, wherein the insulating layer comprises the resin composition according to claim 1.

10. A prepreg comprising a base material impregnated or coated with the resin composition according to claim 1.

11. The prepreg according to claim 10, wherein the base material is at least one material selected from the group consisting of E glass cloth, T glass cloth, S glass cloth, Q glass cloth, and an organic fiber.

12. An insulating layer for a printed circuit board comprising the prepreg according to claim 10.

13. A resin sheet comprising a support coated with the resin composition according to claim 1.

14. An insulating layer for a printed circuit board comprising the resin sheet according to claim 13.

15. A laminate obtained by curing one or more layers of at least one material selected from the group consisting of the prepreg according to claim 10 and the resin sheet according to claim 13.

16. A metal foil-clad laminate obtained by curing a metal foil laminated with at least one material selected from the group consisting of the prepreg according to claim 10 and the resin sheet according to claim 13.

17. A printed circuit board using the insulating layer for the printed circuit board according to claim 9.

18. A printed circuit board comprising the insulating layer for the printed circuit board according to claim 9 and a conductor layer formed on the surface of the insulating layer.

* * * * *